(12) United States Patent
Zhang

(10) Patent No.: US 8,493,718 B2
(45) Date of Patent: *Jul. 23, 2013

(54) SERVER

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 247 days.

This patent is subject to a terminal disclaimer.

(21) Appl. No.: 13/034,706

(22) Filed: Feb. 25, 2011

(65) Prior Publication Data

US 2012/0134086 A1 May 31, 2012

(30) Foreign Application Priority Data

Nov. 30, 2010 (CN) .......................... 2010 1 0575793

(51) Int. Cl.
*H05K 7/04* (2006.01)
(52) U.S. Cl.
USPC ............ 361/679.02; 361/679.01; 361/679.22; 361/679.39; 361/679.6
(58) Field of Classification Search
USPC .................................................. 361/679.02
See application file for complete search history.

(56) References Cited

U.S. PATENT DOCUMENTS

| | | | | |
|---|---|---|---|---|
| 6,621,692 | B1 * | 9/2003 | Johnson et al. | 361/679.55 |
| 6,730,850 | B2 * | 5/2004 | Tsutsumi et al. | 174/111 |
| 6,862,174 | B2 * | 3/2005 | Chien et al. | 361/679.33 |
| 2007/0230110 | A1 * | 10/2007 | Starr et al. | 361/685 |
| 2010/0254100 | A1 * | 10/2010 | Kim et al. | 361/752 |

* cited by examiner

*Primary Examiner* — Tuan T Dinh
*Assistant Examiner* — Mukund G Patel
(74) *Attorney, Agent, or Firm* — CKC & Partners Co., Ltd.

(57) ABSTRACT

A server including a chassis, a motherboard, a panel, a transfer plate and a circuit board is provided. The motherboard is disposed in the chassis. The panel is disposed pluggably in the chassis and is located at a front end of the chassis. The transfer plate is fixed at a rear end of the chassis, and is electrically connected to the motherboard. The circuit board is fixed on the panel and is located in the chassis, and the circuit board includes at least one electronic device and a connector. The panel exposes the electronic device, and the circuit board is electrically connected to the transfer plate through the connector.

12 Claims, 10 Drawing Sheets

SERVER

CROSS-REFERENCE TO RELATED APPLICATION

This application claims the priority benefit of China application serial no. 201010575793.1, filed Nov. 30, 2010. The entirety of the above-mentioned patent application is hereby incorporated by reference herein and made a part of this specification.

BACKGROUND

1. Field of the Invention

The invention relates to an electronic device. Particularly, the invention relates to a server.

2. Description of Related Art

In today's information age, computers have become a necessity in life and work of human being, regardless of servers, workstations, desktop computers or notebook computers, or even industrial computers, the computers become indispensable tools in people's daily life and work.

Taking a desktop computer as an example, it mainly includes a host, a display and peripheral devices. The host includes a computer chassis, and electronic components such as a motherboard, a central processing unit (CPU), a memory, a hardware disk, a floppy disk and a CD-ROM drive, etc. are disposed in the computer chassis.

Further, besides the motherboard, the host further includes small circuit boards configured with electronic elements such as switches, etc. When the circuit boards are assembled, according to a conventional assembling method, a plurality of screws is used to fix the circuit boards on the computer chassis of the host. However, according to such assembling method, a plurality of pillars is first screwed-locked on the computer chassis, and then the screws are screw-locked on the pillars, so as to assemble the circuit boards on the computer chassis. In this way, times for screw-locking is increased, which may cause inconvenience in assembling and waste of time.

SUMMARY OF THE INVENTION

The invention is directed to a server, in which an electronic signal can be sent to a motherboard through a circuit board located at a front end of a chassis.

The invention provides a server including a chassis, a motherboard, a panel, a transfer plate and a circuit board. The motherboard is disposed in the chassis. The panel is disposed pluggably in the chassis and is located at a front end of the chassis. The transfer plate is fixed at a rear end of the chassis opposite to the front end, and is electrically connected to the motherboard. The circuit board is fixed on the panel and is located in the chassis, and the circuit board includes at least one electronic element and a connector. The panel exposes the electronic element, and the circuit board is electrically connected to the transfer plate through the connector.

In an embodiment of the invention, the server further includes an electronic module disposed in the chassis. The chassis has a division member for dividing a first containing space and a second containing space. The motherboard and the electronic module are slidingly disposed in the first containing space and the second containing space from the front end, respectively. The transfer plate is located at a rear end of the first containing space.

In an embodiment of the invention, the panel includes a first plate portion, a second plate portion and a fixing pillar. The first plate portion has an embedded portion, and the embedded portion has a groove. A side edge of a lower end of the circuit board is embedded in the groove. The second plate portion is vertically connected to the first plate portion. The circuit board is parallel to the second plate portion. The fixing pillar is connected to the second plate portion. A top surface of the fixing pillar is fixed to a first surface of the circuit board, and the connector is located at a second surface of the circuit board opposite to the first surface. A fixing member penetrates through an upper end of the circuit board and is fixed to the fixing pillar.

In an embodiment of the invention, the embedded portion has a first bending portion and a second bending portion respectively connected to the first plate portion. The groove is located between the first bending portion and the second bending portion.

In an embodiment of the invention, the first bending portion has a first position limiting portion and a second position limiting portion, the second bending portion has a third position limiting portion and a fourth position limiting portion. The first position limiting portion and the third position limiting portion are located on a same plane, and the second position limiting portion and the fourth position limiting portion are located on a same plane.

In an embodiment of the invention, a distance between the first position limiting portion and the second position limiting portion is slightly greater than a thickness of the circuit board.

In an embodiment of the invention, the first plate portion has a support portion located at bottom of the groove and between the first bending portion and the second bending portion.

In an embodiment of the invention, the second plate portion has a plurality of openings, and the electronic elements of the circuit board face towards the openings along a direction parallel to the first plate portion. The openings respectively expose the electronic elements.

In an embodiment of the invention, a shape of the groove is complied with a shape of the side edge of the circuit board.

In an embodiment of the invention, the embedded portion is formed on the first plate portion in protrusion.

In an embodiment of the invention, the server further includes a cable arranging module. The cable arranging module includes a fixing frame, a chain structure and a cable set. The fixing frame is fixed on the division member. The chain structure is formed by a plurality of pivoted elements pivoted in sequence. A first end of the chain structure is connected to the fixing frame, and a second end of the chain structure is connected to the electronic module. The fixing frame and the chain structure commonly form a cable containing space. The cable set is located in the cable containing space and electrically connected to the transfer plate and the electronic module. When the electronic module is located in the chassis, the chain structure is bended and contained in the chassis. When the electronic module is pulled out from the chassis, the chain structure drives the cable set to be curved and move. When the electronic module is pulled out from the chassis entirely, the chain structure is extended and at least partially located out of the chassis.

In an embodiment of the invention, the server further includes a first sliding rail, a second sliding rail, a first sliding member and a second sliding member. The first sliding rail and the second sliding rail are disposed in the chassis and located at two sides of the second containing space. The first sliding member and the second sliding member are slidingly disposed on the first sliding rail and the second sliding rail, respectively. The electronic module is connected to the first sliding member and the second sliding member and located between the first sliding rail and the second sliding rail. The electronic module is adapted to be entirely pulled out from the front end of the chassis as the first sliding member and the second sliding member are slid relative to the first sliding rail and the second sliding rail.

In an embodiment of the invention, the fixing frame is extended along a first axial line, and the first axial line is parallel to an extending direction of the first sliding rail and located under the first sliding rail. When the electronic module is located in the chassis, a part of the chain structure is carried by the first sliding rail, and is located on a second axial line parallel to the first axial line. When the electronic module is slid out from the chassis along the first sliding rail and the second sliding rail, the chain structure carried by the first sliding rail departs from the first sliding rail along the second axial line, and is partially moved to the first axial line, and a part of the cable set is curved along with the chain structure.

In an embodiment of the invention, the division member includes a first division plate and a second division plate. The first division plate is located at a side of the first containing space, and the second division plate is located at a side of the second containing space. The panel is located at the front end of the chassis corresponding to a place between the first division plate and the second division plate, and a wire is arranged between the first division plate and the second division plate.

According to the above descriptions, the panel of the server is pluggably disposed in the chassis and located at the front end of the chassis, so that the electronic elements exposed by the panel can be used to send electronic signals to the motherboard.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
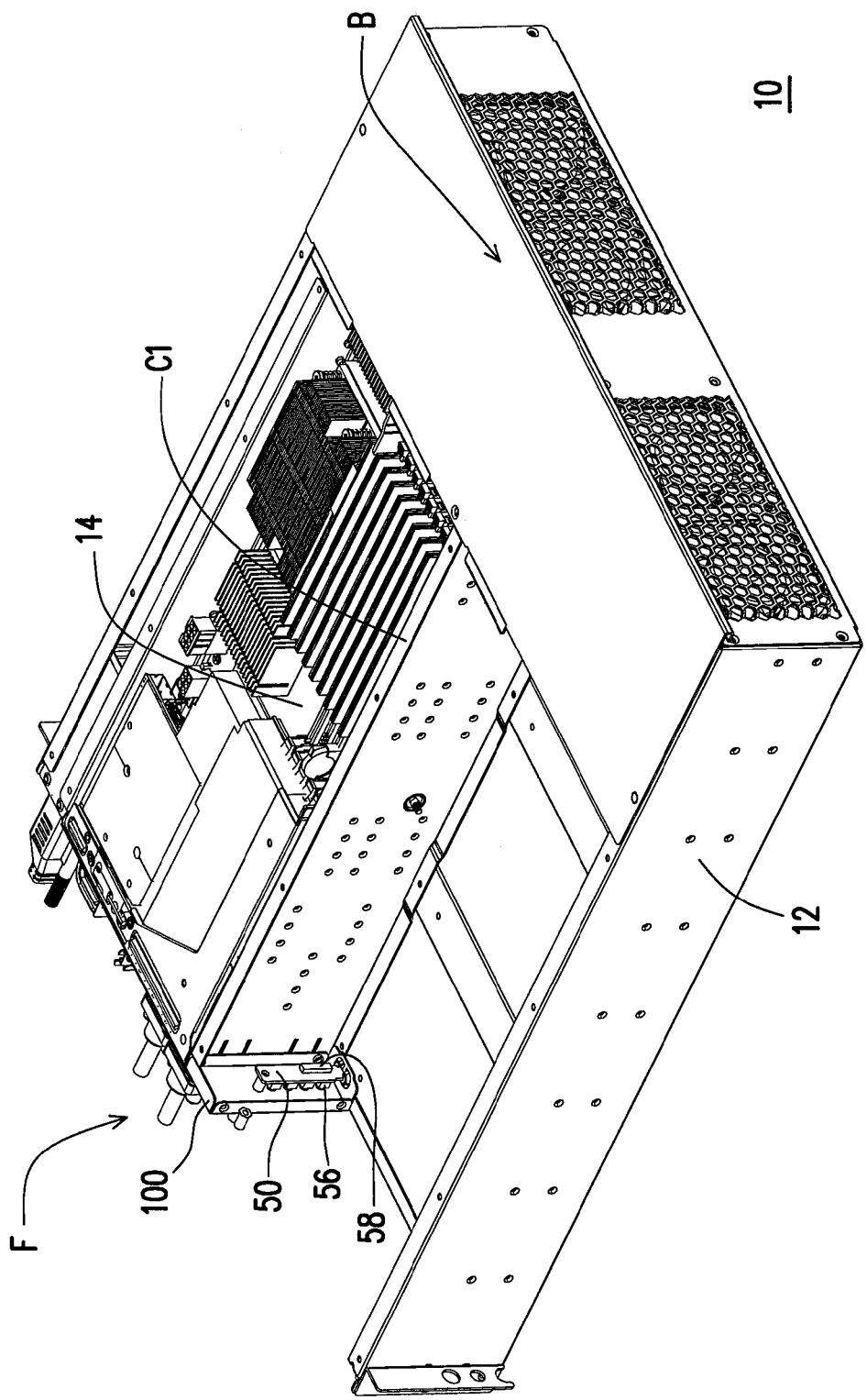
FIG. 1 is a three-dimensional view of a server according to an embodiment of the invention.
Figure 2:
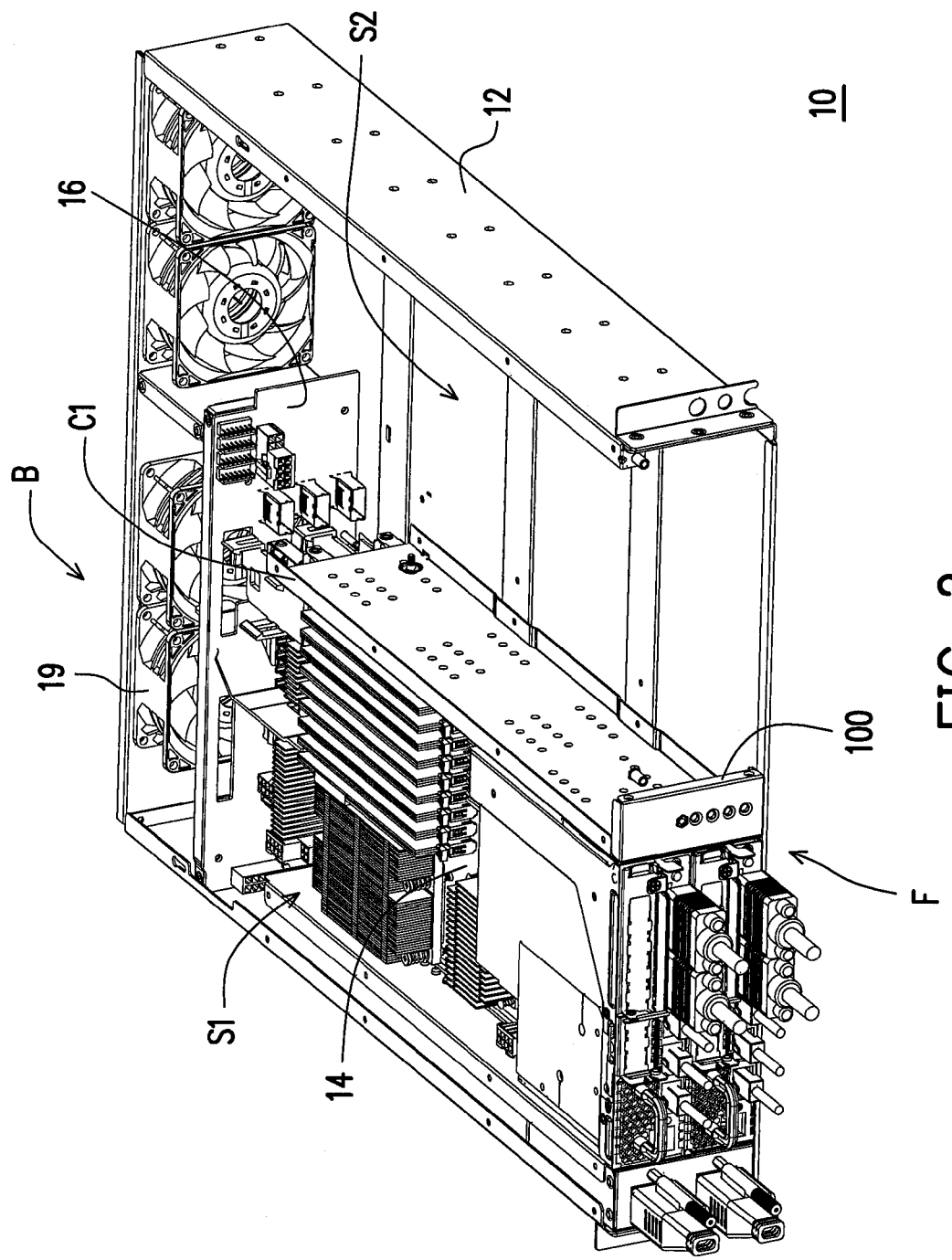
FIG. 2 is a three-dimensional view of the server of FIG. 1 viewing from another viewing angle.

FIG. 1 is a three-dimensional view of a server according to an embodiment of the invention, and FIG. 2 is a three-dimensional view of the server of FIG. 1 viewing from another viewing angle. Referring to FIG. 1 and FIG. 2, the server 10 includes a chassis 12, a motherboard 14, a panel 100, a transfer plate 16 and a circuit board 50. The motherboard 14 is disposed in the chassis 12. The panel 100 is disposed pluggably in the chassis 12 and is located at a front end F of the chassis 12. The transfer plate 16 is fixed at a rear end B of the chassis 12, and is, for example, electrically connected to the motherboard 14 through a cable (not shown).

The circuit board 50 is fixed on the panel 100 and is located in the chassis 12. The circuit board 50 includes at least one electronic element 56 and a connector 58. The panel 100 exposes the electronic elements 56, and the circuit board 50 is electrically connected to the transfer plate 16 through the connector 58. In the present embodiment, the electronic elements 56 are, for example, push switches, light emitting diodes or other components, which are not limited by the invention. Moreover, the connector 58 can be electrically connected to the transfer plate 16 through another cable (not shown), so as to connect the motherboard 14 through the transfer plate 16.

Figure 3:
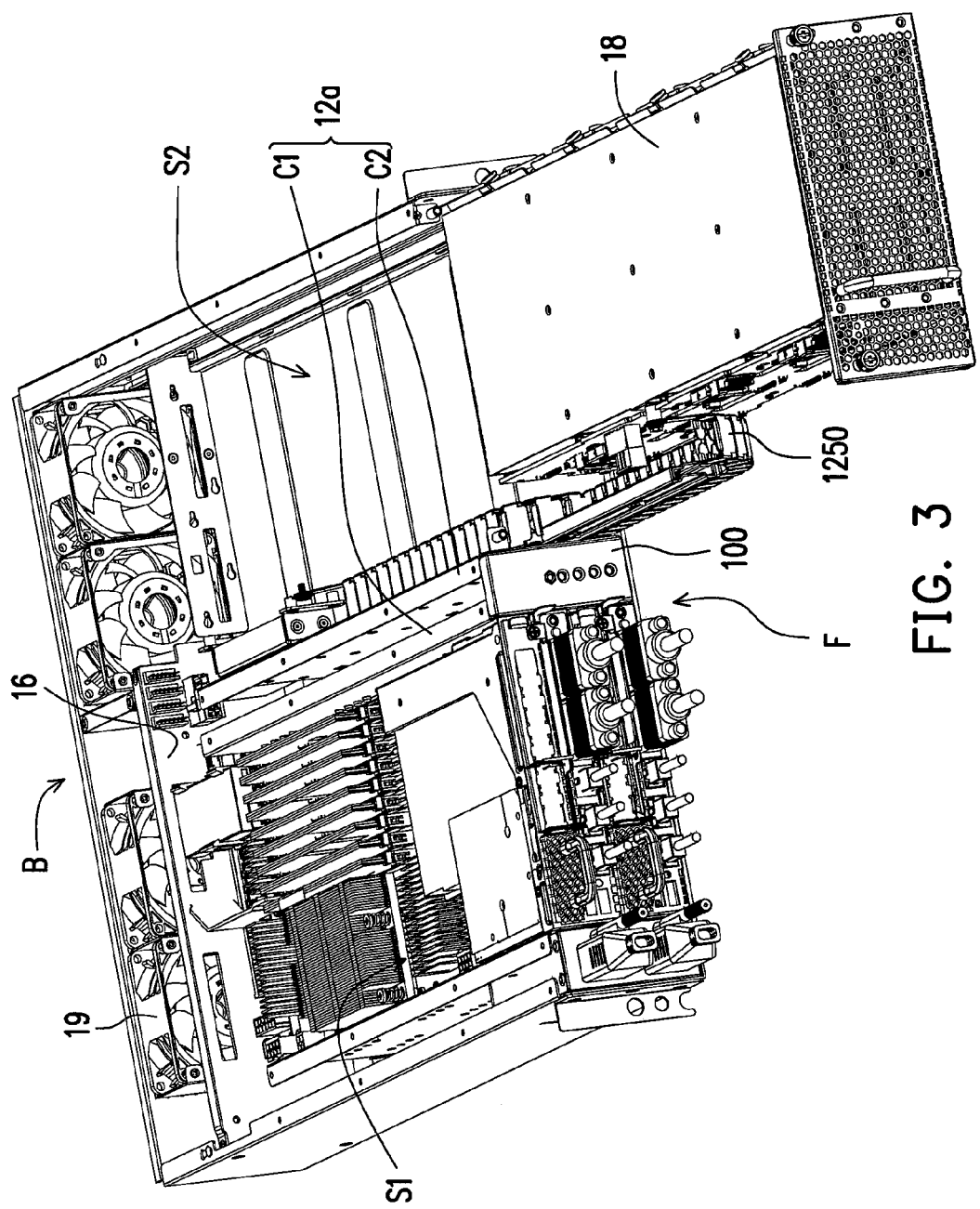
FIG. 3 is a three-dimensional view of an electronic module installed in the server of FIG. 1.

FIG. 3 is a three-dimensional view of an electronic module installed in the server of FIG. 1. Referring to FIG. 2 and FIG. 3, in the present embodiment, the server 10 may further include an electronic module 18 disposed in the chassis 12. The chassis 12 has a division member 12a for dividing a first containing space S1 and a second containing space S2. The panel 100 can be located on the chassis 12 at a position corresponding to the division member 12a, i.e. approximately at a central portion of the chassis 12. The motherboard 14 and the electronic module 18 are slidingly disposed in the first containing space S1 and the second containing space S2 from the front end F, respectively. In the present embodiment, the division member 12a includes a first division plate C1 and a second division plate C2. The first division plate C1 is located at a side of the first containing space S1, and the second division plate C2 is located at a side of the second containing space S2. The panel 100 is located at the front end F of the chassis 12 corresponding to a place between the first division plate C1 and the second division plate C2, and a wire (not shown) can be arranged between the first division plate C1 and the second division plate C2 and electrically connected to the transfer plate 16.

Figure 4:
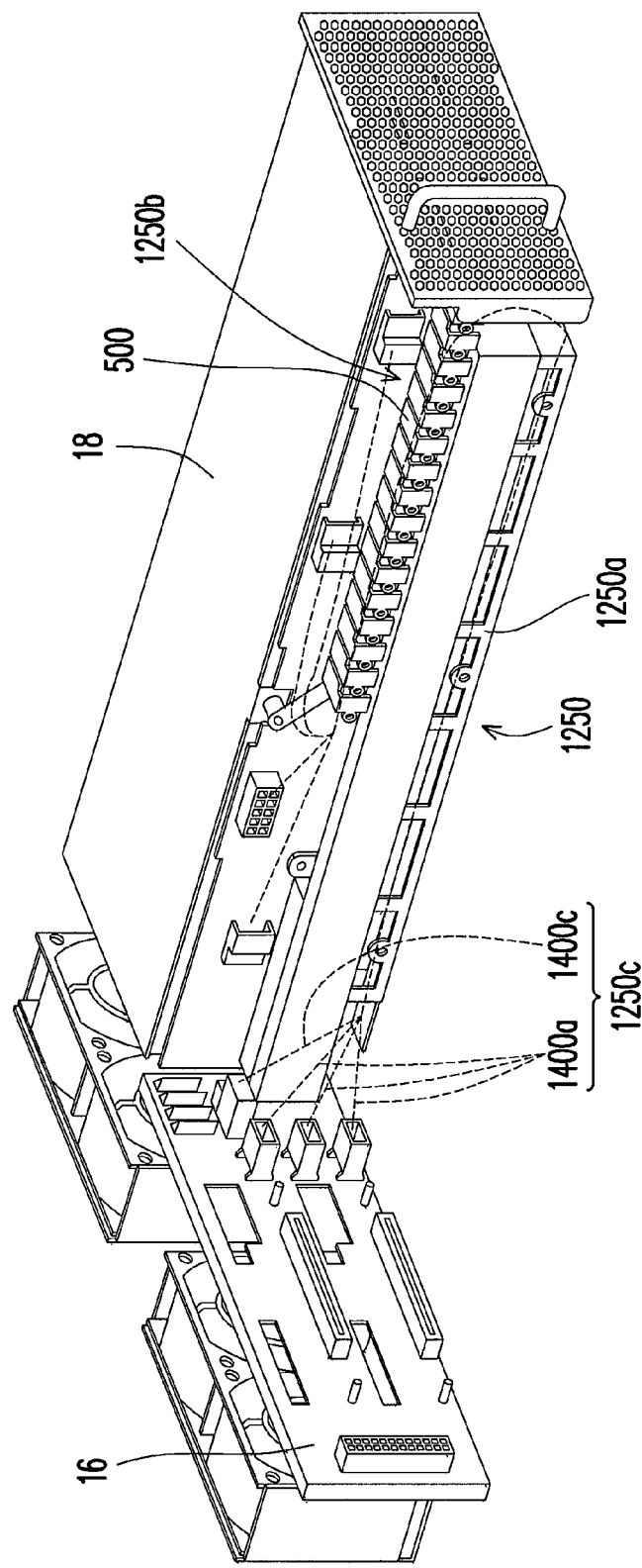
FIG. 4 is a three-dimensional view of a part of components of FIG. 3.

FIG. 4 is a three-dimensional view of a part of components of FIG. 3. Referring to FIG. 3 and FIG. 4, the server 10 may further includes a cable arranging module 1250. The cable arranging module 1250 includes a fixing frame 1250a, a chain structure 1250b and a cable set 1250c. The cable set 1250c is formed by a plurality of data transmission lines 1400a and a power line 1400c. The fixing frame 1250a is fixed on the division member 12a. The chain structure 1250b is formed by a plurality of pivoted elements 500 pivoted in sequence. One end of the chain structure 1250b is connected to the fixing frame 1250a, and another end of the chain structure 1250b is connected to the electronic module 18. The fixing frame 1250a and the chain structure 1250b commonly form a cable containing space. The cable set 1250c is located in the cable containing space and electrically connected to the transfer plate 16 and the electronic module 18.

Moreover, the server 10 may further include a plurality of fan modules 19 located at the rear end B of the chassis. Further, the transfer plate 16 is located between the fan module 19 and the motherboard 14, and is erected in the chassis 12.

Figure 5:
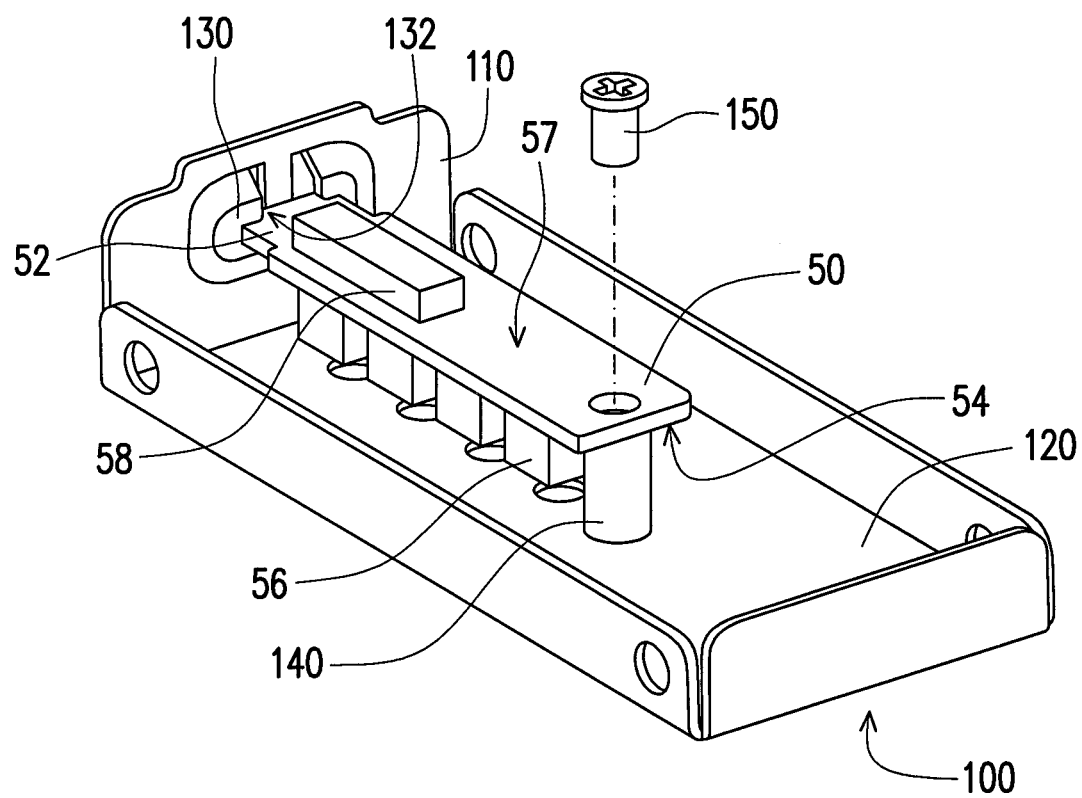
FIG. 5 is a schematic diagram of a circuit board fixed on a panel of FIG. 1.
Figure 6:
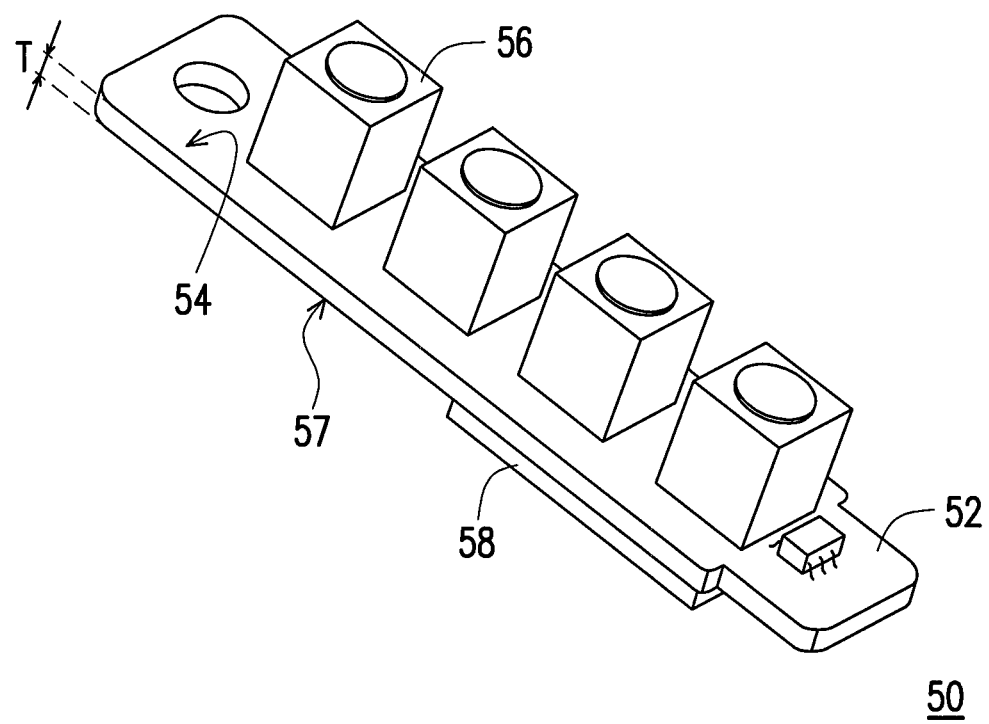
FIG. 6 is a schematic diagram of the circuit board of FIG. 5.

FIG. 5 is a schematic diagram of the circuit board fixed on the panel of FIG. 1, and FIG. 6 is a schematic diagram of the circuit board of FIG. 5. Referring to FIG. 5 and FIG. 6, the panel 100 is adapted to fix the circuit board 50. The panel 100 includes a first plate portion 110, a second plate portion 120, an embedded portion 130 and a fixing pillar 140. The second plate portion 120 is vertically connected to the first plate portion 110. The first plate portion has the embedded portion 130, and the embedded portion 130 has a groove 132. In the present embodiment, the first plate portion 110 and the second plate portion 120 are, for example, formed integrally, and a material thereof can be a metal material such as aluminium, iron, etc.

The circuit board 50 is parallel to the second plate portion 120, and a side edge 52 of a lower end of the circuit board 50 is embedded in the groove 132. In detail, a shape of the groove 132 is, for example, complied with a shape of the side edge 52 of the circuit board 50, so as to facilitate inserting the side edge 52 of the circuit board 50 into the groove 132 or disassembling it from the groove 132. The fixing pillar 140 is connected to the second plate portion 120, wherein a top surface of the fixing pillar 140 faces to a first surface 54 of the circuit board 50. In the present embodiment, the fixing pillar 140 is, for example, a copper pillar, which can be connected to the second plate portion 120 through screw locking.

In another embodiment that is not illustrated, the fixing pillar 140 and the second plate portion 120 can also be formed integrally, which is not limited by the invention. Moreover, the panel 100 further includes a fixing member 150 (for example, a screw), which penetrates through an upper end of the circuit board 50 and is fixed to the fixing pillar 140. In another embodiment that is not illustrated, the fixing member 150 can also be a rivet, though the invention is not limited thereto.

Figure 7:
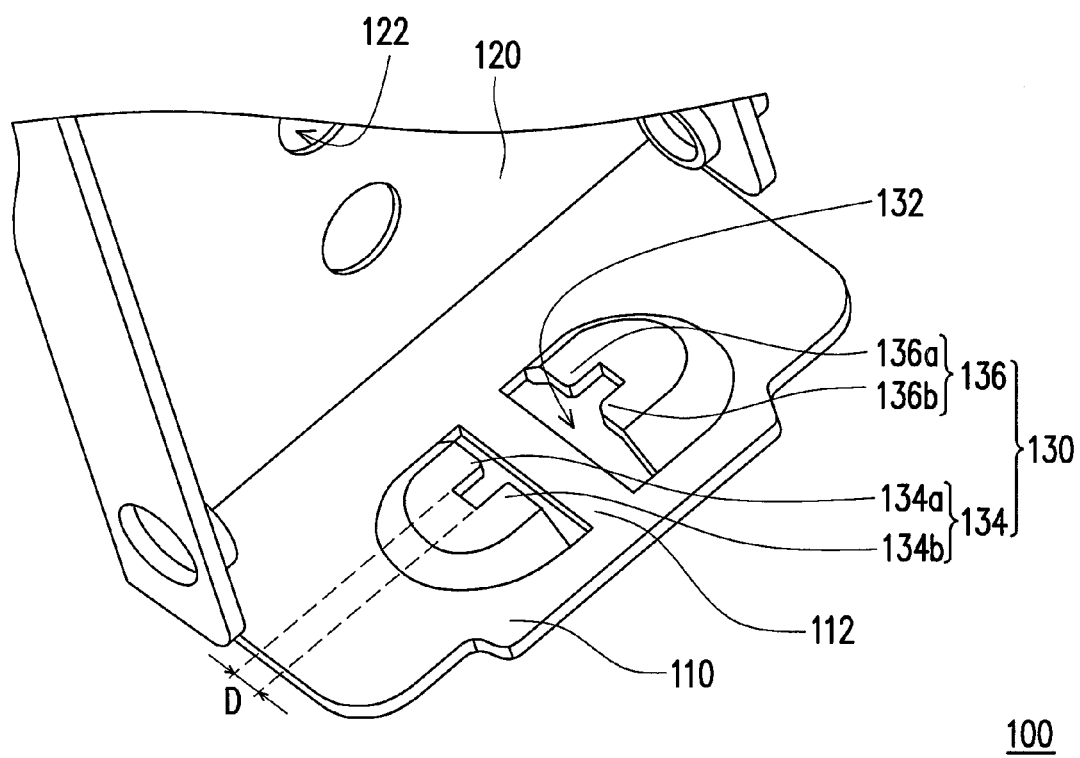
FIG. 7 is a partial enlarged view of the panel of FIG. 5.

FIG. 7 is a partial enlarged view of the panel of FIG. 5. Referring to FIG. 7, the embedded portion 130 includes a first bending portion 134 and a second bending portion 136, which can be formed on the first plate portion 110 in protrusion. The first bending portion 134 and a second bending portion 136 are respectively connected to the first plate portion 110, and the groove 132 is located between the first bending portion 134 and the second bending portion 136, and regarding a fabrication method thereof, two protrusion bumps can be forged on the first plate portion 110 of the metal material, so as to respectively form the first bending portion 134 and the second bending portion 136.

In the present embodiment, the first bending portion 134 has a first position limiting portion 134a and a second position limiting portion 134b, the second bending portion 136 has a third position limiting portion 136a and a fourth position limiting portion 136b. The first position limiting portion 134a and the third position limiting portion 136a are located on a same plane, and the second position limiting portion 134b and the fourth position limiting portion 136b are located on a same plane, so as to respectively support two opposite surfaces of the circuit board 50. Moreover, a distance D between the first position limiting portion 134a and the second position limiting portion 134b is, for example, slightly greater than a thickness T of the circuit board 50 (referring to FIG. 2), so as to facilitate inserting the side edge 52 of the circuit board 50 into the groove 132 or disassembling it from the groove 132.

Moreover, the first plate portion 110 may have a support portion 112 located at bottom of the groove 132 and located between the first bending portion 134 and the second bending portion 136. Further, the support portion 112 can be formed when the protrusion bumps of the first plate portion 110 are forged, so as to maintain integrity of the first plate portion 110 and maintain a structural strength of the first plate portion 110. In the present embodiment, the second plate portion 120 may have a plurality of openings 122. The electronic elements 56 are located on the first surface 54 of the circuit board 50 and face towards the openings 122 along a direction parallel to the first plate portion 110, so that the openings 122 respectively expose the electronic elements 56 (referring to FIG. 1). Moreover, the connector 58 is located on a second surface 57 of the circuit board 50 opposite to the surface 54, so as to electrically connect to the transfer plate 16.

Figure 8:
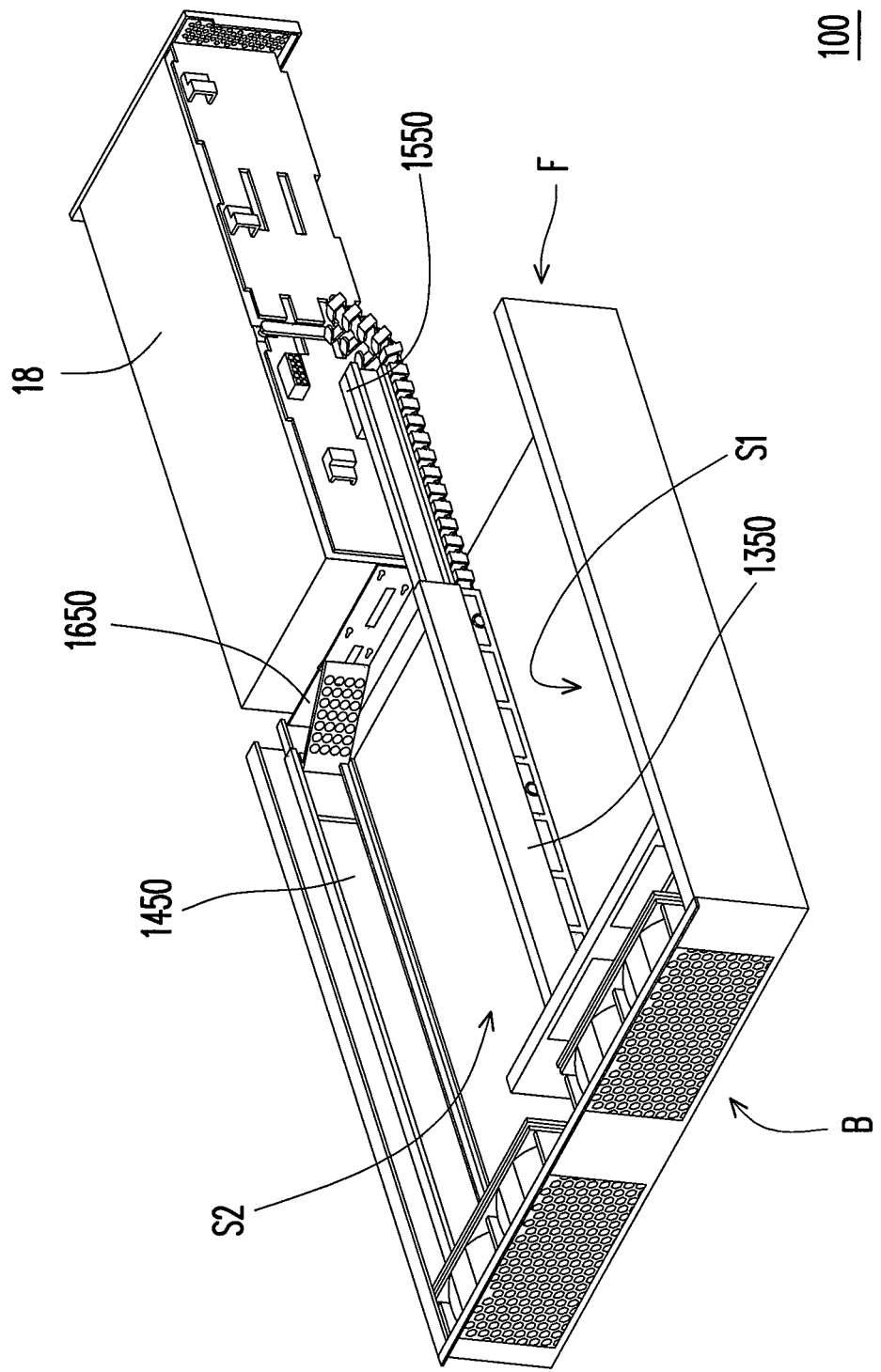
FIG. 8 is a three-dimensional view of a part of components of the server of FIG. 3.

FIG. 8 is a three-dimensional view of a part of components of the server of FIG. 3. Referring to FIG. 8, the server 10 further includes a first sliding rail 1350, a second sliding rail 1450, a first sliding member 1550 and a second sliding member 1650. The first sliding rail 1350 and the second sliding rail 1450 are disposed in the chassis 12 and located at two opposite sides of the second containing space S2. The first sliding member 1550 and the second sliding member 1650 are slidingly disposed on the first sliding rail 1350 and the second sliding rail 1450, respectively, wherein the electronic module 18 is connected to the first sliding member 1550 and the second sliding member 1650, and is located between the first sliding rail 1350 and the second sliding rail 1450. The electronic module 18 can be totally pulled out from the front end F of the chassis 12 as the first sliding member 1550 and the second sliding member 1650 are slid relative to the first sliding rail 1350 and the second sliding rail 1450, as that shown in FIG. 8.

Figure 9:
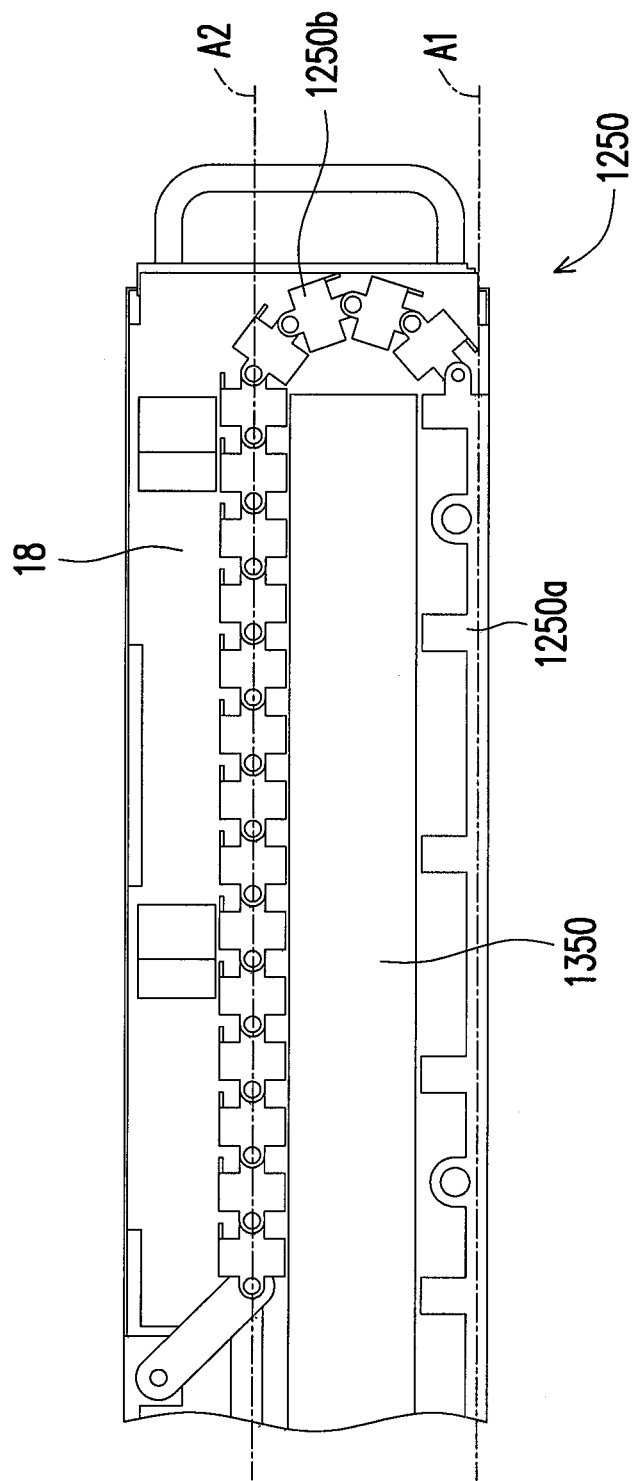
FIG. 9 is a partial side view of a cable arranging module of FIG. 4.
Figure 10:
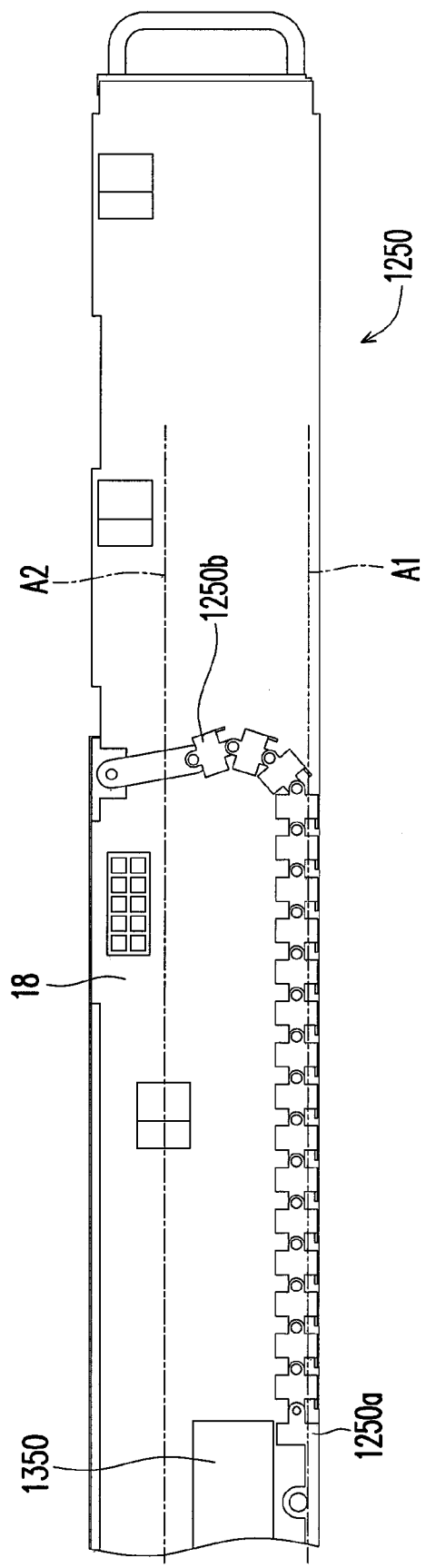
FIG. 10 is a partial side view of a cable arranging module of FIG. 3.

FIG. 9 is a partial side view of the cable arranging module of FIG. 4, and FIG. 10 is a partial side view of the cable arranging module of FIG. 3. Referring to FIG. 9 and FIG. 10, the fixing frame 1250a is extended along a first axial line A1, and the first axial line A1 is parallel to an extending direction of the first sliding rail 1350 and located under the first sliding rail 1350. When the electronic module 18 is located in the chassis 12, a part of the chain structure 1250b is carried by the first sliding rail 1350, and is located on a second axial line A2 parallel to the first axial line A1. When the electronic module 18 is slid out from the chassis 12 along the first sliding rail 1350 and the second sliding rail 1450 as that shown in FIG. 8, the chain structure 1250b carried by the first sliding rail 1350 departs from the first sliding rail 1350 along the second axial line A2, and is partially moved to the first axial line A1, and a part of the cable set 1250c (shown in FIG. 4) is curved along with the chain structure 1250b.

In summary, the panel of the server is pluggably disposed in the chassis and located at the front end of the chassis, so that the electronic elements exposed by the panel can be used to send electronic signals to the motherboard. Moreover, in the server of the invention, the side edge of the circuit board can be embedded in the groove of the embedded portion, and the fixing pillar can be used to fix the circuit board so as to fix the circuit board relative to the panel. Therefore, the circuit board can be conveniently and simply fixed. Moreover, when the circuit board is to be disassembled, as long as a fixing relation between the fixing pillar and the circuit board is released, the circuit board can be moved out from the groove. Therefore, time required for maintenance or replacing components of the circuit board can be effectively reduced. In addition, the fixing relation between the circuit board and the fixing pillar can be achieved through only one fixing member. Therefore, when the circuit board is to be disassembled, it can be implemented by only disassembling one fixing element without disassembling multiple fixing elements, which can considerably save manpower and time. Moreover, besides the embedded portion, the first plate portion may further form a support portion, so as to maintain a structural strength of the first plate portion.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A server, comprising:
   a chassis, having a division member for dividing a first containing space and a second containing space, the division member comprises:
      a first division plate, located at a side of the first containing space; and
      a second division plate, located at a side of the second containing space;
   a motherboard, disposed in the chassis;
   a panel, disposed pluggably in the chassis and located at a front end of the chassis;
   a transfer plate, fixed at a rear end of the chassis opposite to the front end, and electrically connected to the motherboard; and
   a circuit board, fixed on the panel and located in the chassis, and having at least one electronic element and a connector, wherein the panel exposes the electronic element, and the circuit board is electrically connected to the transfer plate through the connector;
   an electronic module, disposed in the chassis, wherein the motherboard and the electronic module are slidingly disposed in the first containing space and the second containing space from the front end, respectively, the transfer plate is located at a rear end of the first containing space, the panel is located at the front end of the chassis corresponding to a place between the first division plate and the second division plate, and a wire is arranged between the first division plate and the second division plate and electrically connected to the transfer plate.

2. The server as claimed in claim 1, wherein the panel comprises:
   a first plate portion, having an embedded portion, and the embedded portion having a groove, wherein a side edge of a lower end of the circuit board is embedded in the groove;
   a second plate portion, vertically connected to the first plate portion, wherein the circuit board is parallel to the second plate portion;
   a fixing pillar, connected to the second plate portion, wherein a top surface of the fixing pillar is fixed to a first surface of the circuit board, and the connector is located at a second surface of the circuit board opposite to the first surface; and
   a fixing member, penetrating through an upper end of the circuit board and fixed to the fixing pillar.

3. The server as claimed in claim 2, wherein the embedded portion has a first bending portion and a second bending portion respectively connected to the first plate portion, and the groove is located between the first bending portion and the second bending portion.

4. The server as claimed in claim 3, wherein the first bending portion has a first position limiting portion and a second position limiting portion, and the second bending portion has a third position limiting portion and a fourth position limiting portion, wherein the first position limiting portion and the third position limiting portion are located on a same plane, and the second position limiting portion and the fourth position limiting portion are located on a same plane.

5. The server as claimed in claim 4, wherein a distance between the first position limiting portion and the second position limiting portion is slightly greater than a thickness of the circuit board.

6. The server as claimed in claim 2, wherein the first plate portion has a support portion located at bottom of the groove and between the first bending portion and the second bending portion.

7. The server as claimed in claim 2, wherein the second plate portion has a plurality of openings, and the electronic elements of the circuit board face towards the openings along a direction parallel to the first plate portion, so that the openings respectively expose the electronic elements.

8. The server as claimed in claim 2, wherein a shape of the groove is complied with a shape of the side edge of the circuit board.

9. The server as claimed in claim 2, wherein the embedded portion is formed on the first plate portion in protrusion.

10. The server as claimed in claim 1, further comprising:
    a cable arranging module, comprising:
    a fixing frame, fixed on the division member;
    a chain structure, formed by a plurality of pivoted elements pivoted in sequence, wherein a first end of the chain structure is connected to the fixing frame, and a second end of the chain structure is connected to the electronic module, and the fixing frame and the chain structure commonly form a cable containing space; and
    a cable set, located in the cable containing space and electrically connected to the transfer plate and the electronic module,
    wherein when the electronic module is located in the chassis, the chain structure is bended and contained in the chassis,
    when the electronic module is pulled out from the chassis, the chain structure drives the cable set to be curved and move,
    when the electronic module is pulled out from the chassis entirely, the chain structure is extended and at least partially located out of the chassis.

11. The server as claimed in claim 1, further comprising:
    a first sliding rail and a second sliding rail, disposed in the chassis and located at two sides of the second containing space, respectively; and
    a first sliding member and a second sliding member, slidingly disposed on the first sliding rail and the second sliding rail, respectively, wherein the electronic module is connected to the first sliding member and the second sliding member and located between the first sliding rail and the second sliding rail, the electronic module is adapted to be entirely pulled out from the front end of the chassis as the first sliding member and the second sliding member are slid relative to the first sliding rail and the second sliding rail.

12. The server as claimed in claim 10, wherein the fixing frame is extended along a first axial line, and the first axial line is parallel to an extending direction of the first sliding rail and located under the first sliding rail, when the electronic module is located in the chassis, a part of the chain structure is carried by the first sliding rail, and is located on a second axial line parallel to the first axial line, and when the electronic module is slid out from the chassis along the first sliding rail and the second sliding rail, the chain structure carried by the first sliding rail departs from the first sliding rail along the second axial line, and is partially moved to the first axial line, and a part of the cable set is curved along with the chain structure.

* * * * *